United States Patent

[11] 3,614,557

[72] Inventor Frank R. Holmstrom
Waltham, Mass.

[21] Appl. No. 825,258
[22] Filed May 16, 1969
[45] Patented Oct. 19, 1971
[73] Assignee The United States of America as represented by the Administrators of the National Aeronautics and Space Administration

[54] SHIELDED-CATHODE MODE BULK EFFECT DEVICES
6 Claims, 3 Drawing Figs.

[52] U.S. Cl. ........ 317/235 R, 317/234 V, 331/107, 332/31, 307/299
[51] Int. Cl. ........ H01l 11/00, H01l 15/00
[50] Field of Search ........ 317/234, 235, 10; 313/346; 331/107; 332/31; 307/299

[56] References Cited

UNITED STATES PATENTS

| | | | |
|---|---|---|---|
| 3,451,011 | 6/1969 | Uenohara | 317/234 X |
| 3,487,338 | 12/1969 | Matzelle et al. | 317/234 |
| 3,452,222 | 6/1969 | Shoji | 317/234 |
| 3,518,502 | 6/1970 | Dorman et al. | 317/234 |
| 3,535,601 | 10/1970 | Matsukura et al. | 317/234 |

FOREIGN PATENTS

| | | | |
|---|---|---|---|
| 1,432,260 | 2/1966 | France | 317/234 |

OTHER REFERENCES

RCA Technical Notes, "Laser Scanning By Gunn Effect" by J. J. Amodei, April 1968, Vol. 757, pages 1 to 3, Copy in 253, 317/234/10

LSA Diodes, "New Source of Microwave Power," June 1967, Copy in Group 250, 317/234/10

*Primary Examiner*—John W. Huckert
*Assistant Examiner*—Andrew J. James
*Attorneys*—John R. Manning, Herbert E. Farmer and Garland T. McCoy

ABSTRACT: "Gunn effect" microwave diodes are disclosed wherein that portion of the semiconductor material in which the direct current field is below the critical value for negative differential conductivity is shielded from applied radio frequency energy. High-conductance RF shielding is applied to the device in such a manner that applied RF fields interact only with the relatively short length portion of the semiconductor material in which the applied DC field is greater than the threshold for negative differential conductivity.

INVENTOR.
FRANK R. HOLMSTROM
BY
ATTORNEYS

SHIELDED-CATHODE MODE BULK EFFECT DEVICES

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

1. Field of the Invention

The present invention relates to single-crystal semiconductor devices in which there exists a region of high-field negative differential mobility. More particularly, the present invention is directed to enhancing the upper operational frequency limit and heat dissipation characteristics of bulk effect solid-state microwave power sources. Accordingly, the general objects of the present invention are to provide novel and improved methods and apparatus of such character.

2. Description of the Prior Art

While not limited thereto in its utility, the present invention is particularly well suited for incorporation in "Gunn effect" microwave diodes. "Gunn effect" devices are electric-field responsive solid-state devices; typically gallium arsenide (GaAs) diodes which are shaped for the desired operating characteristics. For an explanation of the theory of operation of "Gunn effect" devices, reference may be had to U.S. Pat. No. 3,365,583 which issued to J. B. Gunn on Jan. 23, 1968. "-Gunn effect" devices of usual geometry, having an active GaAs $n-$ region sandwiched between two ohmic contacts or $n+$ regions, are limited in their upper frequency operation by a variety of factors. In the Gunn transit time mode of operation, the upper frequency limiting factor is the length or distance between the anode and cathode, and the frequency of oscillation of the device is nearly equal to the inverse of the transit time of electrons at their peak drift velocity. This is approximately the velocity with which the high-field domains essential to this modes travel from one contact to the other. In circuit-controlled modes of operation; for example the hybrid mode, the LSA mode, and the amplifier mode; the upper frequency of operation of a "Gunn effect" diode is determined by the minimum time required for accumulation layers to form as the applied radio frequency (RF) voltage swings from negative to positive. This time is approximately equal to the dielectric relaxation time of the semiconductor material, the relaxation time being proportional to, $n^{11}$, and the resulting constraint on operating frequency is conveniently expressed as $n/f$ $10^4$, where $n$ is the density of donor impurities in the GaAs. For a further explanation of the factors which limit the upper frequency of operation of bulk effect solid-state microwave power sources, reference may be had to an article entitled "Characterization of Bulk Negative-Resistance Diode Behavior" by J. A. Copeland which appeared at pages 461–463 of the IEEE Transactions on Electron Devices, Volume ED–14, Sept. 1967.

In addition to the above-discussed upper operational frequency limitations, prior art semiconductor devices which rely upon high-field negative differential electron mobility for operation have, in the interest of enhancing operational frequency, been of as small a physical size as possible. The minimization of physical size, of course, presents both heat dissipation and device fabrication problems. Thus, large devices having a small value of $n$ would be favorable for heat dissipation but such physical structure would, it has previously been believed, further restrict the upper operational frequency of bulk effect solid-state microwave power sources.

SUMMARY OF THE PRESENT INVENTION

The present invention overcomes the above-discussed and other limitations and disadvantages of the prior art and in so doing provides improvements to single-crystal semiconductor devices wherein there exists a region of high-field negative differential mobility. These and other improvements are realized by elimination of the requirement for the formation of high-field traveling domains. Secondly, the present invention eliminates the requirement of having a material with a small dielectric relaxation time. Thus, the invention comprises a "-Gunn effect" device having a higher maximum operating frequency than prior art devices of like character. The present invention also enables fabrication of solid-state microwave diodes which are both tunable and of larger size when compared to the prior art. The foregoing improvements are precipitated by shielding from applied radio frequency fields that portion of a "Gunn effect diode in which the direct current electric field is below the critical value for negative differential conductivity. Accordingly, the present invention contemplates the use of high-conductance RF shielding in order that applied RF fields interact only with the relatively narrow region of a solid-state, microwave diode in which the applied DC field is greater than the threshold for negative differential conducivity. To accomplish shielding, an insulating film is applied to at least one side of the diode and the shield material, either metal or heavily doped semiconductive material, is applied over the insulating film in two sections to leave a gap intermediate the anode and cathode regions of the device.

BRIEF DESCRIPTION OF THE DRAWING

The present invention may be better understood and its numerous objects and advantages will become apparent to those skilled in the art by reference to the accompanying drawing wherein like reference numerals refer to like elements in the various figures and in which.

DESCRIPTION OF THE PREFERRED EMBODIMENTS

Figure 1:
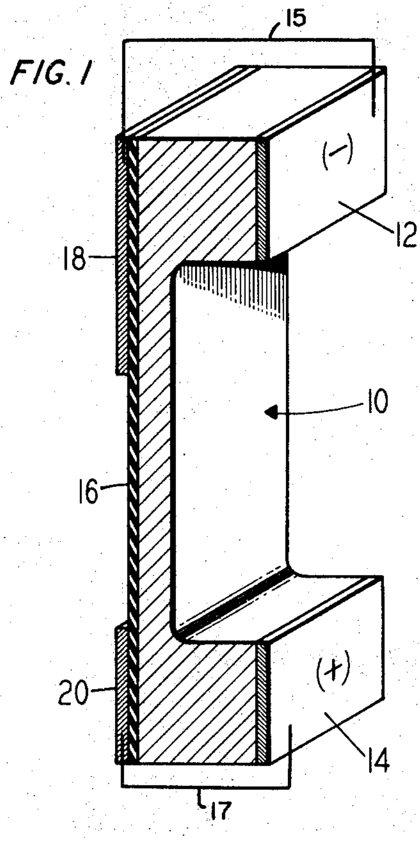
FIG. 1 is an enlarged, isometric view of a first embodiment of a solid-state microwave diode in accordance with the present invention.

With reference now to FIG. 1, a "Gunn effect" diode typically comprises a suitably shaped semiconductor crystal 10; the crystal 10 being comprised of a material which exhibits negative differential conductivity when properly stimulated. In the usual instance, the crystal 10 will be formed from bulk $n-$ conductivity-type GaAs wafers with resistivities of 100–1,000 ohm-cm. The wafers and/or the individual devices are formed into the desired size and shape by lapping and etching techniques standard in the semiconductor art. In accordance with the present invention, in order to achieve enhance heat dissipation, it is desirable (but not mandatory) to form the device so that the crystalline material between the anode and cathode is as large and as thin as possible. Thus, the region of the crystal 10 intermediate the portions to which a pair of ohmic contacts 12 and 14 are attached will typically be lapped and etched to a thickness of 100–200 microns. Contact 12 is the cathode or negative-voltage contact, and contact 14 is the anode or positive-voltage contact. Also in accordance with the present invention, and as a result of the enchanced size possible in devices in accordance with the present invention, the contacts 12 and 14 will be planar ohmic contacts which will typically be vacuum deposited through masks. The contacts 12 and 14 may, for example, be Au-Ge eutectic planar contacts which are alloyed to the device in a purified hydrogen atmosphere.

Up to the present point, the solid-state microwave diode described is, with the exception of its physical dimensions and the use of planar contacts, commensurate with the state of the art existing at the time the present invention was made. In order to achieve the shielded cathode mode of operation contemplated by the invention, the side of the device which will face a source of RF energy is covered with a dielectric layer 16. The dielectric coating 16 may, for example, be a photosensitive resist material such as Eastman Kodak KMER or KPR; or $SiO_2$ could be used. The choice of material for use as the dielectric layer 16 is dictated by the requirements for a good electrical insulator which has electrical and mechanical stability at temperatures moderately above room temperature. High-conductance RF shielding, in the form of a pair of conductive layers 18 and 20, is applied over the dielectric layer 16 in order that applied RF fields interact only with a predetermined portion of the device intermediate the contact regions. The conductive shields 18 and 20 may be comprised of either metal or heavily doped semiconductor material; vapor deposited AuGe eutectic material having been found to give good performance.

In a typical device, the overall width of the crystal 10 is 1 millimeter; the overall length is 2 millimeters; the distance between the ohmic planar contacts or contact regions is 0.7 mm.; and the gap between the shields 18 and 20 is 0.125 mm. The width of the gap for a particular application is determined by the RF impedance level desired, which level is proportional to length. The maximum length is determined by the distance over which it is possible to maintain the DC electric field, which varies along the device, between the minimum and maximum values for the occurrence of negative differential conductivity in the gallium arsenide. The method for calculating the variation of DC electric field as a function of position rests on equations which can be found in an article entitled, "Theory of Negative-Conductance Amplification and of Gunn Instabilities in 'Two-Valley' Semiconductors," by D. E. McCumber and A. G. Chynoweth, which appeared in the *TEEE Transactions on Electron Devices*, Volume ED–13, No. 1, pages 4–21, Jan. 1966.

Figure 3:
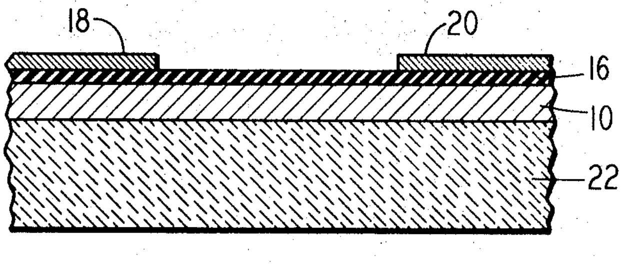
FIG. 3 is an enlarged view of a portion of the device shown in FIG. 2.
Figure 2:
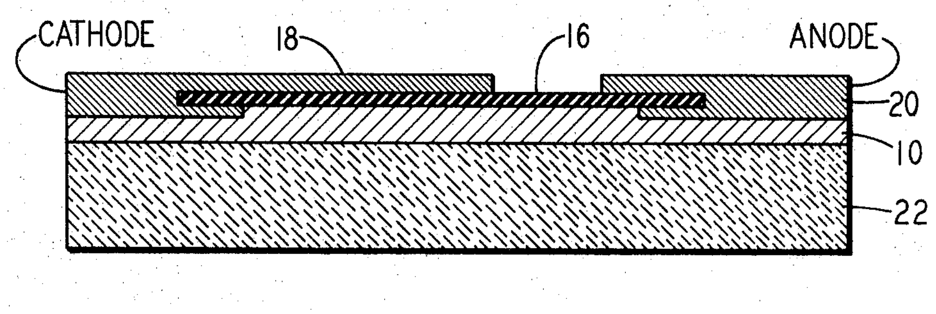
FIG. 2 is a cross-sectional side view of a second embodiment of the present invention.

The device depicted in cross section in FIG. 2 differs from the embodiment of FIG. 1 only in that the body of semiconductor material 10 is supported on a nonconductive substrate 22 which would typically be comprised of a ceramic material. Thus, for example, the fabrication technique may contemplate the gluing of the GaAs wafers to sapphire flats approximately 1 millimeter thick using heat-conducting epoxy. Thereafter, the sandwich structures may be string-sawed into a plurality of rectangular devices having the desired dimensions. The separating of the individual devices may be accomplished either before or after adding the dielectric layer 16 and shields 18 and 20 as desired. It is also to be noted that the embodiment of FIG. 2 contemplates the use of the shield material as the planar contacts thereby eliminating the separate contacts 12 and 14 of the FIG. 1 embodiment:

As is now well known, the DC electric field (E) in a "Gunn effect" diode starts at zero at the cathode and increases monotonically across the diode with a curvature that is concave downwardly where its value is less than the critical value $E_c$, and concave upwardly where E is greater than $E_C$. Further discussion of the behavior of the direct current field in solid-state microwave diodes may be found in the aforementioned article by D. E. McCumber and A. G. Chynoweth. The RF shields 18 and 20 of the present invention serve to "short out" the applied RF field in the region near the cathode where E is less than $E_c$ thereby eliminating the conduction losses caused by this region of positive conductivity. The applied field, however, is coupled to GaAs as shown in FIG. 3, the field fringing into the semiconductor material as shown, the fringing being enhanced by the high dielectric constant of the GaAs. The important feature of the present invention is that the RF fields interact only with the portion of the device adjacent the anode in which the DC electric field is greater than the threshold $E_c$ necessary for negative differential conductivity. This fact makes possible the utilization of the bulk negative differential conductivity of the *n*-GaAs at frequencies as high as the inverse of the internally scattering time for scattering of (100) valley electrons to the (000) central valley in *n*-GaAs a figure believed to be approximately 300 gHz.

As noted above, in the embodiment shown in FIG. 1 the planar contact 14 would comprise the anode of the device whereas in the embodiment of FIG. 2 the shield 20 would function as the anode. In either case, it may be seen that the gap between the shields is off center and toward the end of the device nearest the anode. This is the region where the electric field E first becomes greater than the minimum value, $E_c$, at which negative differential conductivity occurs.

A comparison of GaAs "Gunn effect" microwave diodes in the prior art and shielded-cathode operational modes is believed to be in order. Without the RF shields 18 and 20, the DC I-V characteristic of the device is that of a long transit-time Gunn diode, and the diode breaks into transit-time oscillations above the threshold voltage $E_c$. Application of the shields 18 and 20 suppresses the oscillations; thus, when the device is employed as a bulk effect solid-state microwave power source, the maximum frequency of oscillation is much higher. It is to be noted that the RF shields 18 and 20 may be viewed as elements having nearly infinite dielectric constant in their effect on space-charge dynamics in GaAs. Accordingly, image charges in the shields tend to counteract the space charges in the semiconductor material, and therefore decrease the tendency of traveling high-field domains to form.

While preferred embodiments have been shown and described, various modifications and substitutions may be made thereto without departing from the spirit and scope of the present invention. Accordingly, it is to be understood that the present invention has been described by way of illustration and not limitation.

What is claimed is:

1. A solid-state device comprising:

a body of single-crystal multivalley semiconductor material having the innate property of being responsive to electric fields in excess of a critical electric field magnitude to yield a region in the material in which the drift velocity of electrons decreases as the electric field increases above the critical intensity;

a pair of ohmic contacts spaced from each other and affixed to the surface of said body of material;

insulating means affixed to a surface of said body of material, high-conductance radio frequency shielding means juxtapositioned to at least one side of said body of material and between said ohmic contacts and in contact with said insulating means, said shielding means being discontinuous so as to expose a region of said semiconductor material intermediate said contacts to applied radio frequency fields;

said insulating means electrically isolating said shielding means from said body of material.

2. The device of claim 1 wherein said shielding means comprises:

first and second shields defining a gap therebetween.

3. The device of claim 2 wherein said gap is offset toward the contact which functions as the anode of the solid-state device.

4. The device of claim 3 further comprising:

means electrically connecting each of said shields to adjacent anode and cathode contacts contact.

5. The device of claim 3 further comprising:

a nonconductive substrate supporting said body of semiconductor material.

6. The device of claim 3 wherein said contacts are planar ohmic contacts which are attached to said body of semiconductor material.